(12) United States Patent
Shroff et al.

(10) Patent No.: US 8,658,497 B2
(45) Date of Patent: Feb. 25, 2014

(54) NON-VOLATILE MEMORY (NVM) AND LOGIC INTEGRATION

(75) Inventors: Mehul D. Shroff, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/343,331

(22) Filed: Jan. 4, 2012

(65) Prior Publication Data

US 2013/0171785 A1 Jul. 4, 2013

(51) Int. Cl.
*H01L 21/336* (2006.01)

(52) U.S. Cl.
USPC .................................. 438/258; 257/E21.645

(58) Field of Classification Search
USPC .................................. 438/258; 257/E21.645
See application file for complete search history.

(56) References Cited

U.S. PATENT DOCUMENTS

| | | | |
|---|---|---|---|
| 5,614,746 A | 3/1997 | Hong et al. |
| 6,087,225 A | 7/2000 | Bronner et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |
| 6,777,761 B2 | 8/2004 | Clevenger et al. |
| 6,939,767 B2 | 9/2005 | Hoefler et al. |
| 7,154,779 B2 | 12/2006 | Mokhlesi et al. |
| 7,202,524 B2 | 4/2007 | Kim et al. |
| 7,208,793 B2 | 4/2007 | Bhattaharyya |
| 7,271,050 B2 | 9/2007 | Hill |
| 7,365,389 B1 | 4/2008 | Jeon et al. |
| 7,391,075 B2 | 6/2008 | Jeon et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |

(Continued)

FOREIGN PATENT DOCUMENTS

WO 2009058486 5/2009

OTHER PUBLICATIONS

U.S. Appl. No. 13/307,719, filed Nov. 30, 2011.
U.S. Appl. No. 12/915,726, filed Oct. 29, 2010.

(Continued)

*Primary Examiner* — Wensing Kuo
*Assistant Examiner* — Moazzam Hossain
(74) *Attorney, Agent, or Firm* — Joanna G. Chiu; James L. Clingan, Jr.

(57) ABSTRACT

A method of forming an NVM cell and a logic transistor uses a semiconductor substrate. A metal select gate of the NVM cell is formed over a high-k dielectric as is metal logic gate of a logic transistor. The logic transistor is formed, including forming source/drains, while the metal select gate of the NVM cell is formed. The logic transistor is protected while the NVM cell is then formed including forming a charge storage region using metal nanocrystals and a metal control gate over a portion of the metal select gate and a portion of the charge storage region over the substrate. The charge storage region is etched to be aligned to the metal control gate.

14 Claims, 6 Drawing Sheets

(56) References Cited

U.S. PATENT DOCUMENTS

| | | | |
|---|---|---|---|
| 7,560,767 B2 | 7/2009 | Yasuda et al. | |
| 7,795,091 B2 | 9/2010 | Winstead et al. | |
| 7,816,727 B2 | 10/2010 | Lai et al. | |
| 7,906,396 B1 | 3/2011 | Chiang et al. | |
| 7,989,871 B2 | 8/2011 | Yasuda | |
| 8,063,434 B1 | 11/2011 | Polishchuk et al. | |
| 8,138,037 B2 | 3/2012 | Chudzik et al. | |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Hall et al. | |
| 8,536,007 B2 | 9/2013 | Shroff et al. | |
| 2002/0061616 A1 | 5/2002 | Kim et al. | |
| 2004/0075133 A1 | 4/2004 | Nakagawa et al. | |
| 2006/0046449 A1* | 3/2006 | Liaw | 438/585 |
| 2007/0077705 A1 | 4/2007 | Prinz et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0050875 A1 | 2/2008 | Moon et al. | |
| 2008/0121983 A1 | 5/2008 | Seong et al. | |
| 2008/0145985 A1* | 6/2008 | Chi | 438/199 |
| 2008/0185635 A1 | 8/2008 | Yanagi et al. | |
| 2008/0237700 A1 | 10/2008 | Kim et al. | |
| 2008/0290385 A1* | 11/2008 | Urushido | 257/295 |
| 2008/0308876 A1 | 12/2008 | Lee et al. | |
| 2009/0065845 A1* | 3/2009 | Kim et al. | 257/316 |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0273013 A1* | 11/2009 | Winstead et al. | 257/315 |
| 2009/0278187 A1 | 11/2009 | Toba | |
| 2011/0031548 A1 | 2/2011 | White et al. | |
| 2011/0204450 A1 | 8/2011 | Moriya | |
| 2012/0104483 A1 | 5/2012 | Shroff et al. | |
| 2012/0248523 A1 | 10/2012 | Shroff et al. | |
| 2012/0252171 A1 | 10/2012 | Shroff et al. | |
| 2013/0026553 A1* | 1/2013 | Horch | 257/316 |
| 2013/0037886 A1* | 2/2013 | Tsai et al. | 257/351 |
| 2013/0065366 A1 | 3/2013 | Thomas et al. | |
| 2013/0171785 A1 | 7/2013 | Shroff et al. | |
| 2013/0171786 A1 | 7/2013 | Shroff et al. | |
| 2013/0178027 A1 | 7/2013 | Hall et al. | |
| 2013/0178054 A1 | 7/2013 | Shroff et al. | |
| 2013/0264633 A1 | 10/2013 | Hall et al. | |
| 2013/0264634 A1 | 10/2013 | Hall et al. | |
| 2013/0267074 A1 | 10/2013 | HALL et al. | |

OTHER PUBLICATIONS

U.S. Appl. No. 13/077,491, filed Mar. 31, 2011.
U.S. Appl. No. 13/077,501, filed Mar. 31, 2011.
Lee et al.; Theoretical and Experimental Investigation of Si Nanocrystal Memory Device With HfO2 High-k Tunneling Dielectric; IEEE Transactions on Electron Devices; Oct. 2003; pp. 2067-2072; vol. 50, No. 10, IEEE.
U.S. Appl. No. 13/441,426, filed Apr. 6, 2012.
U.S. Appl. No. 13/491,771, filed Jun. 8, 2012.
U.S. Appl. No. 13/491,760, filed Jun. 8, 2012.
Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/ 50038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao, P., et al., "Nonvolatile Memory Characteristics with Embedded high Density Ruthenium Nanocrystals", http://iopscience.iop.org/ 0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., "Dual Metal Gates with Band-Edge Work Functions on Novel HfLaO High-K Gate Dielectric", IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.
U.S. Appl. No. 13/491,771, Hall et al , "Integrating Formation of a Replacement Ggate Transistor and a Non Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 13, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action—Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.

(56) References Cited

OTHER PUBLICATIONS

U.S. Appl. No. 13/307,719, Shroff, M., et al., "Logic and Non-Volatile Memory (NVM) Integration", Office Action—Allowance, May 29, 2013.

U.S. Appl. No. 13/441,426, Shroff, M., et al., "Non-Volatile Memory (NVM) and Logic Integration", Office Action—Allowance, Sep. 9, 2013.

U.S. Appl. No. 13/780,574, Hall, M.D., et al., "Non-Volatile Memory (NVM) and Logic Integration", Office Action—Allowance, Sep. 6, 2013.

U.S. Appl. No. 13/491,760, Shroff, M.., et al., "Integrating Formation of a Replacement Gate Transistor and a NonVolatile Memory Cell Using an Interlayer Dielectric", Office Action—Allowance, Jul. 1, 2013.

U.S. Appl. No. 13/781,727, Shroff, M., et al., "Methods of Making Logic Transistors and non-Volatile Memory Cells", Office Action—Restriction, Jun. 21, 2013.

Office Action mailed Nov. 22, 2013 in U.S. Appl. No. 13/780,591.
Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
Office Action mailed Jan. 16, 2014 in U.S. Appl. No. 13/491,771.

* cited by examiner

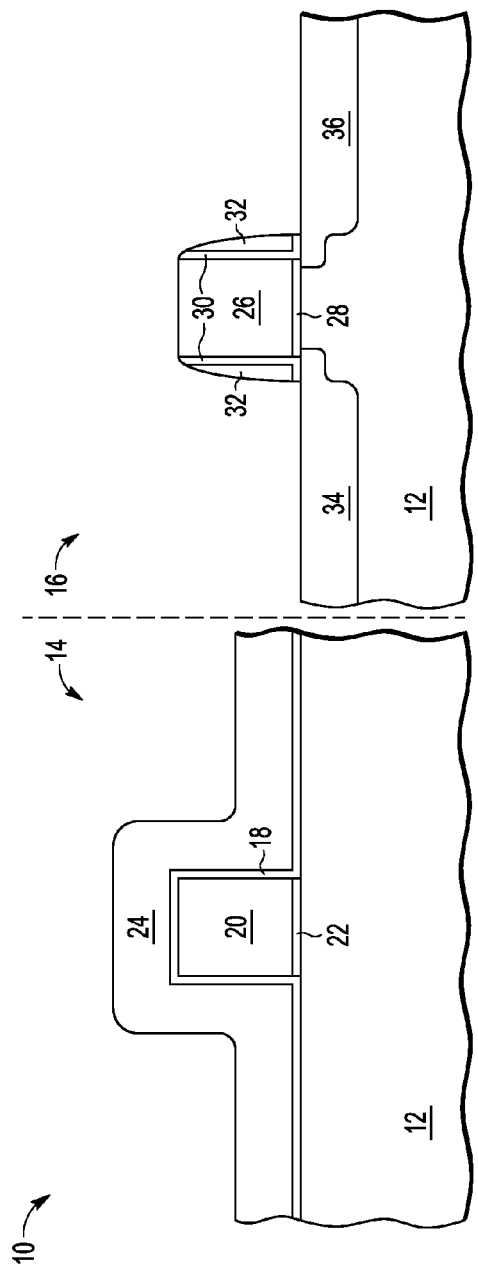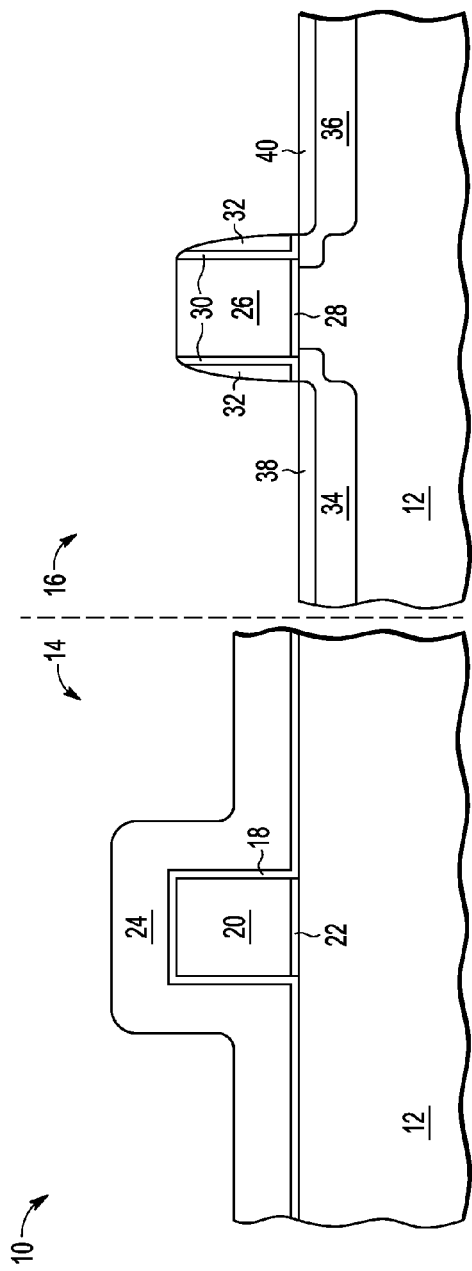

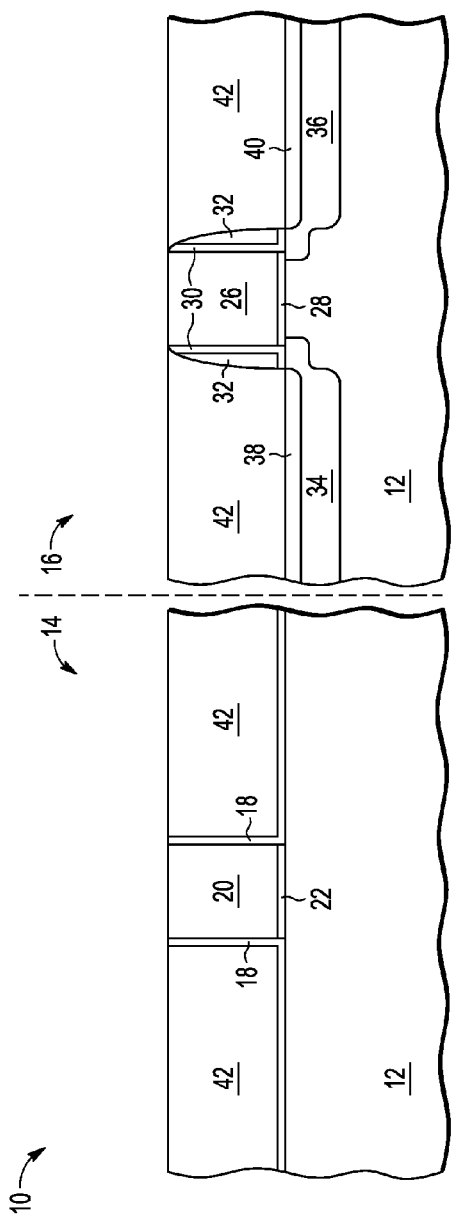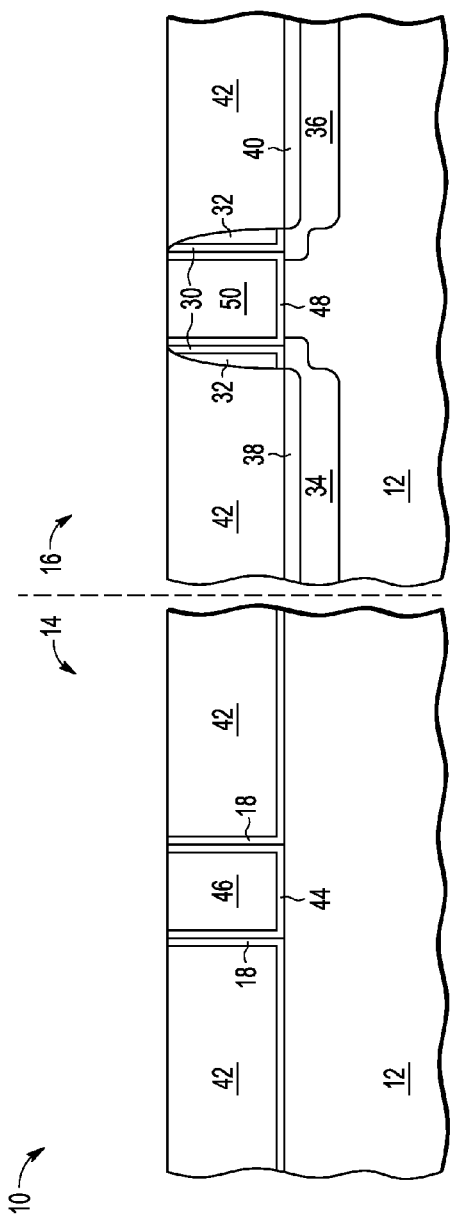

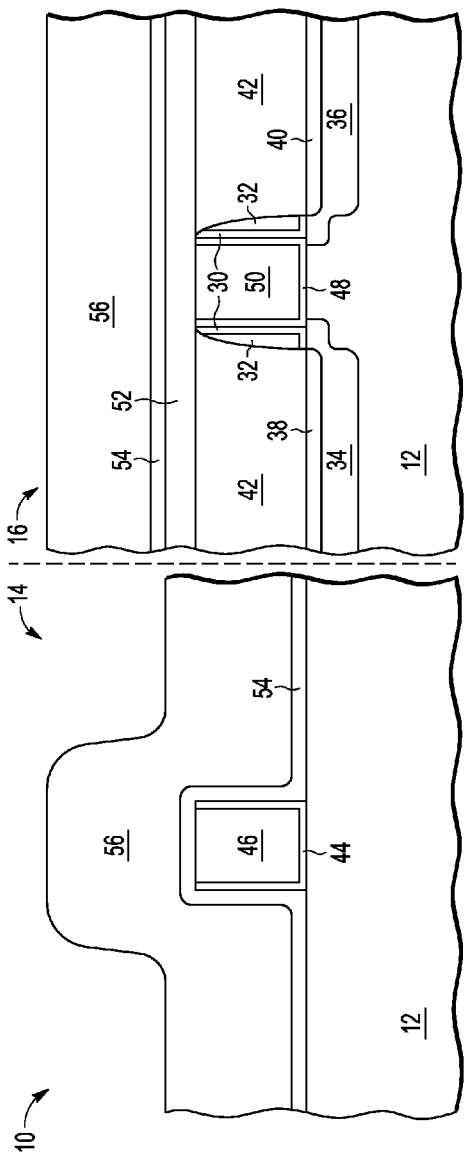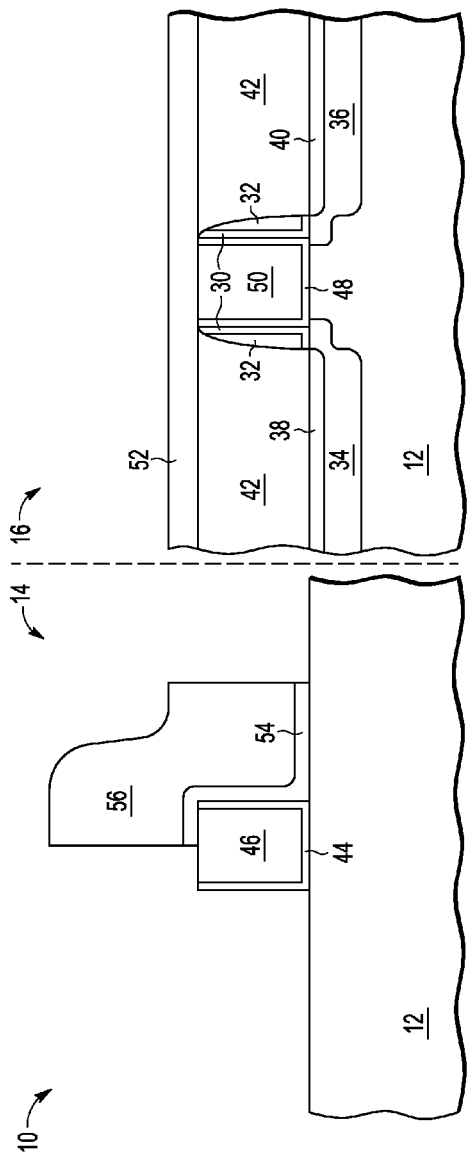

NON-VOLATILE MEMORY (NVM) AND LOGIC INTEGRATION

BACKGROUND

1. Field

The invention relates to non-volatile memories (NVMs), and more particularly, to NVMs integrated with logic devices.

2. Related Art

Non-volatile memories (NVMs) are often on an integrated circuit which also performs other functions. In such cases it is undesirable to sacrifice logic performance in favor of performance of the NVM. Also it is important to avoid or minimize additional cost in achieving high performance for both the logic and the NVM.

Accordingly there is a need to provide further improvement in achieving high performance while also addressing cost increase issues in integrated circuits that have both NVM and logic.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a cross section of a semiconductor device at a stage in processing according to an embodiment;

FIG. 2 is a cross section of the semiconductor device of FIG. 1 at a subsequent stage in processing;

FIG. 3 is a cross section of the semiconductor device of FIG. 2 at a subsequent stage in processing;

FIG. 4 is a cross section of the semiconductor device of FIG. 3 at a subsequent stage in processing;

FIG. 7 is a cross section of the semiconductor device of FIG. 6 at a subsequent stage in processing;

FIG. 8 is a cross section of the semiconductor device of FIG. 7 at a subsequent stage in processing;

DETAILED DESCRIPTION

Figure 5:
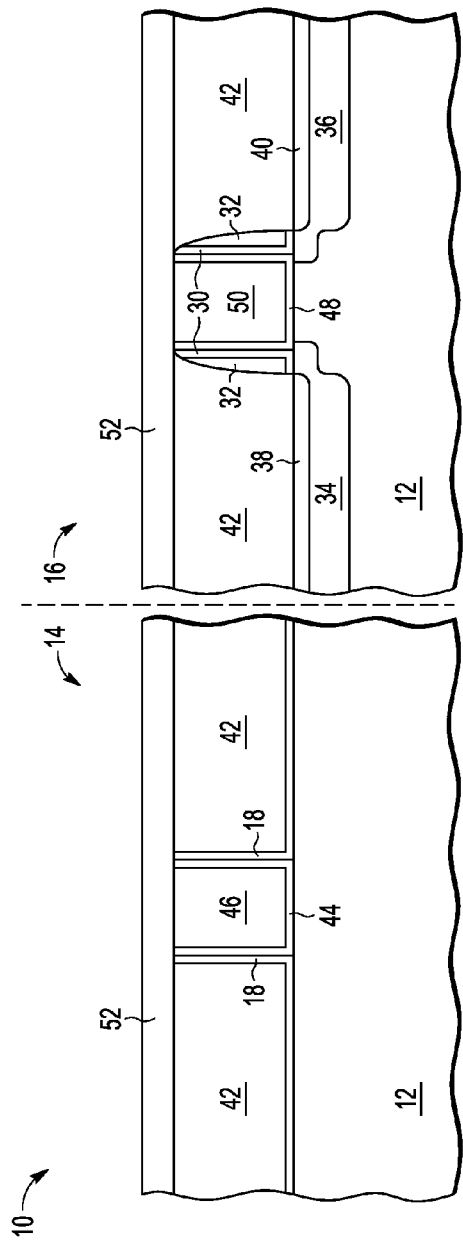
FIG. 5 is a cross section of the semiconductor device of FIG. 4 at a subsequent stage in processing.

A non-volatile memory (NVM) cell is made contemporaneously with logic transistors. This can be done with high-k gate dielectrics, metal gates, and metal nanocrystals. In one embodiment, a replacement gate process is used to form both the gate of the logic transistor as well as the metal gate for the select gate of the NVM cell. The source/drain regions for the logic transistors and the silicidation for the logic transistors are formed prior to replacement of the dummy gates in the logic region while the NVM areas remain protected by a protection layer. After replacement of the dummy gates with the actual select gate and actual logic gate, the dielectric layer surrounding the actual select gate is removed from the NVM areas (while being maintained around the logic gate in the logic areas), after which, the charge storage layer and control gate are formed. Furthermore, the source/drain regions and silicidation for the NVM cells can be completed while the logic areas remain protected. This is better understood by reference to the drawings and the following written description.

Shown in FIG. 1 is a semiconductor device 10 having a substrate 12. Semiconductor device 10 is divided into an NVM region 14 and a logic region 16. NVM region 14 is for forming an NVM cell which, in this described example, is an N-channel NVM cell. Logic region 16 is for forming a logic transistor of the same doping type as the NVM cell and may be referenced as an N-channel region because the NVM cell being formed is N-channel. Note that alternatively, logic region 16 may be used for forming a P-channel transistor or forming both N-channel and P-channel transistors. Semiconductor device 10 includes a dummy gate dielectric 22 over substrate 12 in NVM region 14 and a dummy gate 20 over dummy gate dielectric 22. Semiconductor device 10 also includes a dummy gate dielectric 28 over substrate 12 in logic region 16, and a dummy gate 26 over dummy gate dielectric 28. Dummy gate dielectrics 22 and 28 and dummy gates 20 and 26 may be formed by first blanket depositing or thermally growing a dielectric layer over substrate 12 and then blanket depositing a gate layer (which may be, for example, a polysilicon layer or a nitride layer). The dielectric and gate layers may then be patterned to form the dummy gate dielectrics and dummy gates. After formation of the dummy gate dielectrics and dummy gates, photo resist may be used to protect NVM region 14 while shallow implants are formed into substrate 12 in logic region 16 to form source/drain extension regions extending laterally from the sidewalls of dummy gate 26. After formation of the extension regions, a liner layer 18 is formed over substrate 12 and dummy gates 20 and 26, and a protection layer 24 is formed over liner layer 18 in both NVM region 14 and logic region 16. Again, NVM region 14 may be protected by photo resist while an anisotropic etch is performed in logic region 16 to form a spacer liner 30 and sidewall spacer 32 surrounding dummy gate 26. Note that liner 30 is formed from liner layer 18 and spacer 32 from protection layer 24. In one embodiment, liner layer 18 is an oxide layer while protection layer 24 is a nitride layer. In one embodiment, protection layer 24 has a thickness of at least 500 Angstroms. After formation of spacer 32, while NVM region 14 may remain protected by photo resist, deep implants may be performed to form source/drain regions 34 and 36 in substrate 12, adjacent sidewalls of dummy gate 26. Note that source/drain regions 34 and 36 include the extension regions previously formed which extend slightly under dummy gate 26. The photo resist protecting NVM region 14 may then be removed.

Shown in FIG. 2 is semiconductor device 10 after forming silicide regions 38 and 40. Substrate 12, in logic region 16, is silicided to form silicide regions 38 and 40. During the silicidation in logic region 16, protection layer 24 protects NVM region 14 such that no silicide regions are formed in NVM region 14.

Shown in FIG. 3 is semiconductor device 10 after depositing an interlevel dielectric (ILD) layer 42 and performing a chemical mechanical polish (CMP) to expose top surfaces of dummy gates 20 and 26. Protection layer 24 in NVM region 14 may be removed prior to depositing ILD layer 42.

Shown in FIG. 4 is semiconductor device 10 after replacement of dummy gates 20 and 26 and dummy gate dielectrics 22 and 28. Dummy gates 20 and 26 and dummy gate dielectrics 22 and 28 are first removed, thus creating openings in ILD 42 which expose substrate 12. A high-k gate dielectric layer is then formed over ILD 42 and within these openings in ILD 42 and a gate stack layer is then formed over the high-k gate dielectric layer, also within these openings in ILD 42. A CMP is then performed to remove regions of the high-k gate dielectric layer and gate stack layer from over ILD 42 such that these layers remain only within the openings of ILD 42. Therefore, within each opening in ILD 42 in NVM region 14, a high-k gate dielectric 44 is formed along substrate 12 and sidewalls of ILD 42, and a gate stack 46 is formed on high-k gate dielectric 44, between sidewalls of ILD 42. Within each opening in ILD 42 in logic region 16, a high-k gate dielectric 48 is formed along substrate 12 and sidewalls of ILD 42, and a gate stack 50 is formed on high-k gate dielectric 48, between sidewalls of ILD 42. Therefore, note that a top surface of ILD 42 is substantially aligned with a top surface of each of gate stack 46 and gate stack 50.

High-k gate dielectrics 44 and 48 may be oxides of a metal, such as, for example, hafnium oxide, lanthanum oxide, aluminum oxide, and tantalum oxide. The gate stack layer, and therefore gate stacks 46 and 50, may include a metal that is chosen for its effectiveness in setting the work function of the transistor. For example, in the case of an N-channel transistor or NVM cell, the metal may be tantalum carbide or lanthanum. In the case of a P-channel transistor, the metal may be molybdenum or titanium nitride. The gate stack layer, and therefore gate stacks 46 and 50, may also include an additional one or more metals on the work-function-setting metal, where the top most metal of the gate stack may be referred to as the top metal. Examples of the additional metal include aluminum, tungsten, tungsten nitride, and tantalum nitride. Many other metals may also be used. The gate stack layer may also include polysilicon that is silicided with metals such as, for example, nickel or cobalt. Although referenced as a gate stack, it may be feasible for gate stacks 46 and 50 to be just one type of metal rather than a stack of different metal types.

Gate stacks 46 and 50 may also be referred to as replacement gates or actual gates, and gate dielectrics 44 and 48 may be referred to as replacement gate dielectrics or actual gate dielectrics, in which gate stacks 46 and 50 and gate dielectrics 44 and 48 are formed using a replacement gate process and remain as part of semiconductor device 10 upon completion. Gate stack 46 corresponds to the select gate of an NVM cell being formed in NVM region 14 and may therefore also be referred to as select gate 46. Gate stack 50 corresponds to the gate of a logic transistor being formed in logic region 16 and may therefore also be referred to as logic gate 50. It may be noted that while it is preferable to have the select gate dielectric and stack match one of the logic transistors, it is also feasible to have a separate and unique stack for the select gate.

Shown in FIG. 5 is semiconductor device 10 after forming a hard mask layer 52 in regions 14 and 16, over ILD 42 and over gate stacks 46 and 50. In one embodiment, hard mask layer 52 may be nitride. The hard mask layer also functions as an etch-stop layer.

Figure 6:
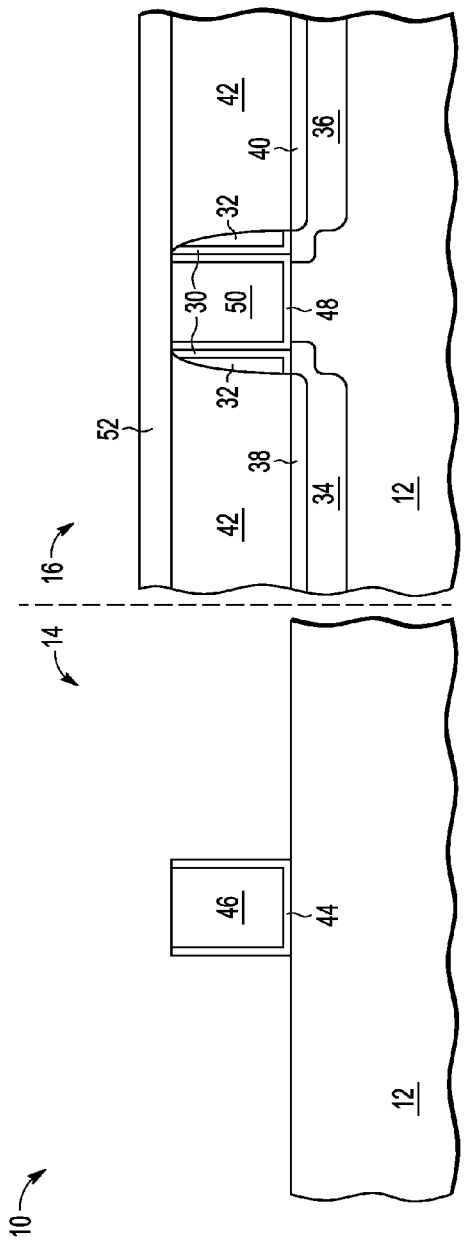
FIG. 6 is a cross section of the semiconductor device of FIG. 5 at a subsequent stage in processing.

Shown in FIG. 6 is semiconductor device 10 after patterning ILD 42 and hard mask layer 52 to remove ILD 42 and hard mask layer 52 from NVM region 14. Note that ILD 42 and hard mask layer 52 remain in logic region 16.

Shown in FIG. 7 is semiconductor device 10 after depositing a charge storage layer 54 that is for use as a charge storage layer of the NVM cell being formed in NVM region 14. Charge storage layer 54 is formed over gate stack 46 and substrate 12 in NVM region 14 and over hard mask layer 52 in logic region 16. A gate stack layer 56 is deposited over charge storage layer 54. Gate stack layer 56 may be a stack of conductive layers including one or more metal layers or a single metal layer as for gate stack 46. Gate stack layer 56 is for use as a control gate of the NVM cell being formed in NVM region 14 and may also be referred to as control gate layer. Charge storage layer 54 is preferably formed of metal nanocrystals that are formed on a first high-k dielectric layer. A second high-k dielectric layer is formed over and between the metal nanocrystals. Note that the first high-k dielectric layer may be referred to as a base or tunneling dielectric layer, and the second high-k dielectric layer as a fill or blocking dielectric layer which is formed around and over the metal nanocrystals. This is feasible because there is no exceptionally high heating step required before, during, or after formation of charge storage layer 54.

Shown in FIG. 8 is semiconductor device 10 after patterning gate stack layer 56 to remove gate stack layer 56 from logic region 16 and to form a control gate in NVM region 14. Therefore, control gate 56 overlaps a sidewall of select gate 46. After patterning gate stack layer 56 in NVM region 14, charge storage layer 54 is etched to leave a remaining portion of charge storage layer 54 aligned to control gate 56.

Figure 9:
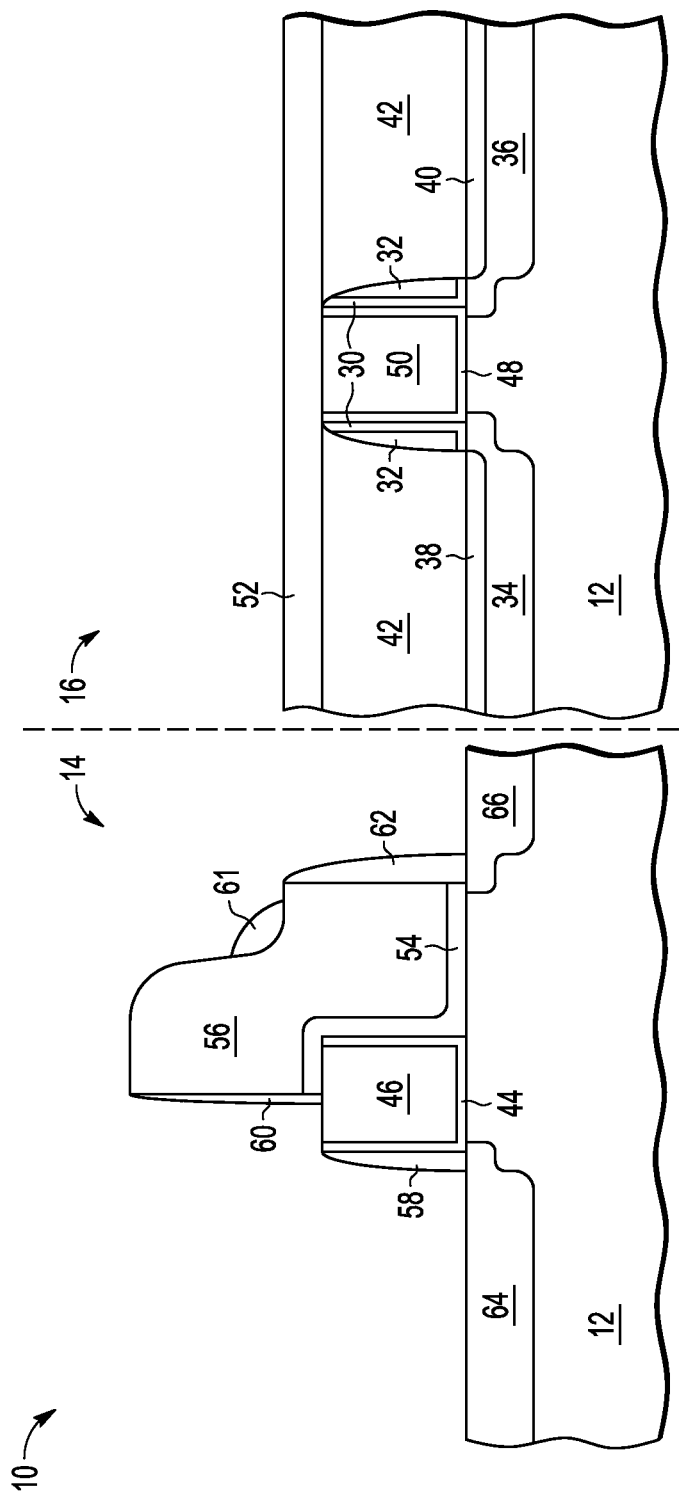
FIG. 9 is a cross section of the semiconductor device of FIG. 8 at a subsequent stage in processing.

Shown in FIG. 9 is semiconductor device 10 after formation of source/drain regions 64 and 66 and sidewall spacers 58, 60, 61, and 62 adjacent an exposed sidewall of select gate 46 and adjacent sidewalls of control gate 56. In one embodiment, shallow implants are performed to first form extension regions in substrate 12 which laterally extend from each of the exposed sidewall of select gate 46 and the sidewall of control gate 56 that is over substrate 12 and laterally spaced apart from select gate 46. After formation of the extension regions, sidewalls spacers 58, 60, 61, and 62 may be formed. This may be achieved by conformally depositing nitride and performing an anisotropic etch. After formation of the sidewall spacers, deep implants may be performed to form source/drain regions 64 and 66 in substrate 12 which laterally extend from each of the exposed sidewall of select gate 46 and the sidewall of control gate 56 that is laterally spaced apart from select gate 46. Therefore, note that source/drain regions 64 and 66 may include the previously formed extension regions.

Figure 10:
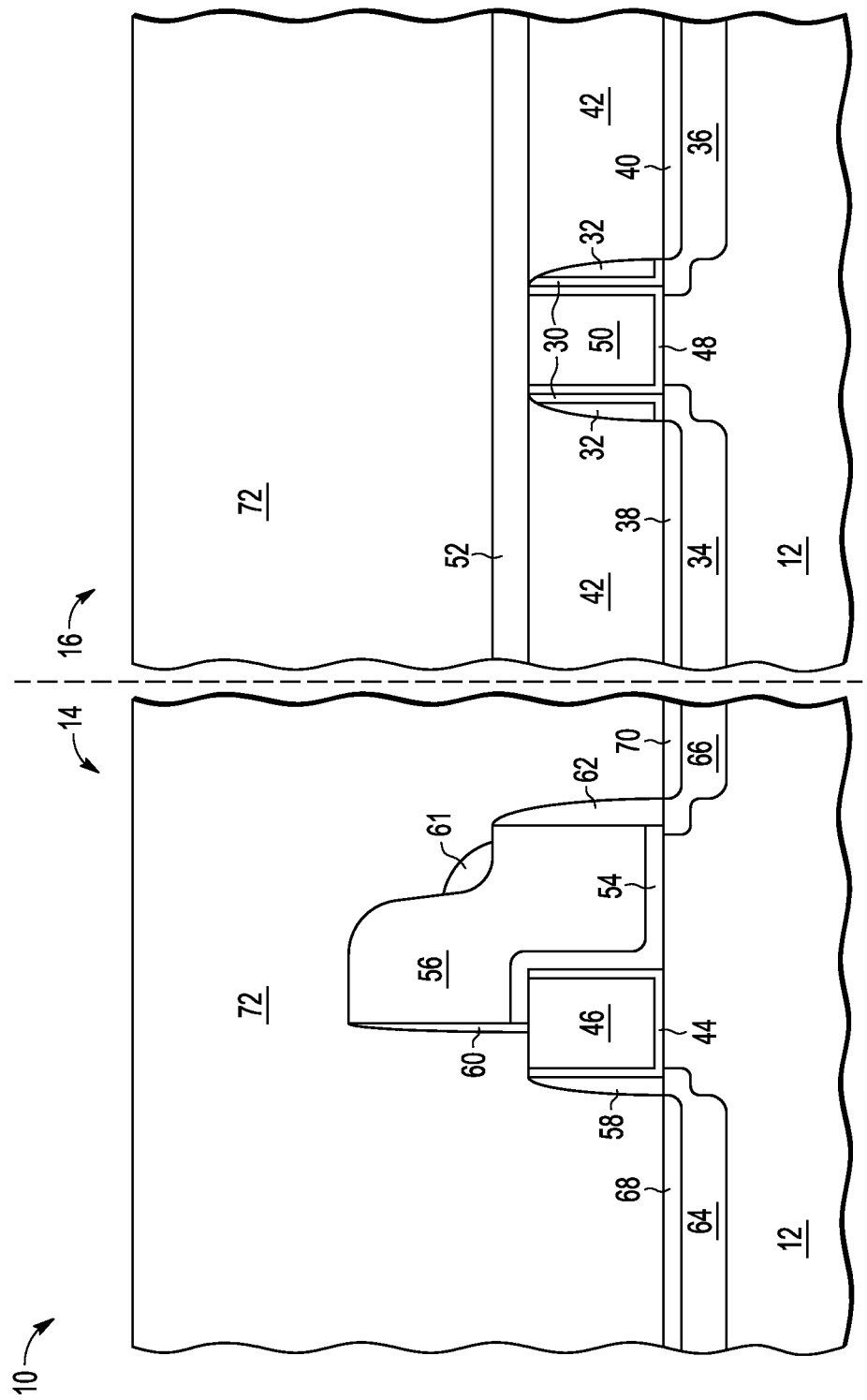
FIG. 10 is a cross section of the semiconductor device of FIG. 9 at a subsequent stage in processing.

Shown in FIG. 10 is semiconductor device 10 after formation of silicide regions 68 and 70 in source/drain regions 64 and 66, respectively, in NVM region 14 and formation and subsequent planarization of an ILD 72 in NVM region 14 and logic region 16. During silicidation to form silicide regions 68 and 70, hard mask layer 52 protects logic region 16. ILD 72 is then formed over the NVM cells in NVM region 14 (e.g. over select gate 46 and control gate 56) and over hard mask layer 52 in logic region 16.

Note that in the illustrated embodiment, source/drain regions 64 and 66 are not formed at the same processing stage as source/drain regions 34 and 36, prior to deposition of ILD 42. Instead, they are formed later in processing. That is, they are formed after formation of the actual (i.e. replacement) gate dielectric and gate stack and after removal of ILD 42. The second ILD, ILD 72, is then formed over substrate 12, source/drain regions 64 and 66, and select gate 46 and control gate 56.

Thus is shown an efficient manufacturing process for forming NVM cells and logic transistors that allows for high performance materials in both the NVM cell and the logic transistors. The high-k materials need not face exceptionally high temperatures that would threaten their integrity.

Although the invention is described herein with reference to specific embodiments, various modifications and changes can be made without departing from the scope of the present invention as set forth in the claims below. For example, different gate stacks may be formed using the replacement gate process for different types of devices which may be integrated with NVM split gate devices. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming an NVM cell and a logic transistor using a semiconductor substrate, including, in a non-volatile memory (NVM) region, forming over the semiconductor substrate a first high-k gate dielectric, a metal select gate, and a first dielectric layer, wherein the metal select gate is on the first high-k dielectric, a top surface of the first dielectric layer is substantially aligned with a top surface of the metal select gate, and the first dielectric layer has a first opening in which the metal select gate is present in the first opening; in a logic region, forming over the semiconductor substrate a second high-k gate dielectric, a metal logic gate, a source and a drain in the semiconductor substrate, and a second dielectric layer, wherein the metal logic gate is on the second high-k dielectric, a top surface of the second dielectric layer is substantially aligned with a top surface of the metal logic gate, and the second dielectric layer has a second opening in which the metal logic gate is present in the second opening; removing the first dielectric layer in the NVM region while leaving the second dielectric layer in the logic region; forming a charge storage layer comprising metal nanocrystals over the NVM region including over the metal select gate; forming a metal layer over the charge storage layer; patterning the metal layer to form a metal control gate; and etching the charge storage layer to leave a remaining portion of the storage layer aligned to the metal control gate. Item 2 include the method of item 1, wherein the forming the charge storage layer is further characterized by forming the charge storage layer over the second dielectric layer and the metal logic gate; and the etching the storage layer is further characterized by removing the charge storage layer over the second dielectric and the metal logic gate. Item 3 includes the method of item 2, wherein the step of forming the metal layer is further characterized by forming the metal layer over the logic region; and the step of patterning the metal layer is further characterized by removing the metal layer over the logic region. Item 4 includes the method of item 3, wherein the forming the first dielectric layer and forming the second dielectric layer are further characterized as forming the first dielectric and the second dielectric layers simultaneously of a same material. Item 5 includes the method of item 1, and further includes forming a first silicide region on the source and a second silicide region on the drain of the logic transistor prior to the forming of the second dielectric layer. Item 6 includes the method of item 5 and further includes forming a sidewall spacer around the metal logic gate prior to the forming the second dielectric layer. Item 7 includes the method of item 6 and further includes forming a liner around the metal logic gate prior to the forming the sidewall spacer. Item 8 includes the method of item 7, and further includes forming a hard mask over the NVM region and the logic region prior to the removing the first dielectric layer. Item 9 includes the method of item 8, and further includes removing the hard mask from over the NVM region while leaving the hard mask over the logic region prior to removing the first dielectric layer. Item 10 includes the method of item 1, wherein the forming the metal select gate and the forming the logic gate include a replacement gate process. Item 11 includes the method of item 1, wherein the forming the logic gate includes forming a stack comprising a work-function-setting metal on the first high-k gate dielectric and a top metal over the work-function-setting metal. Item 12 includes the method of item 1, wherein the forming the metal logic gate includes forming a stack having a first composition and the forming the metal select gate includes forming a stack having a second composition wherein the first composition is different from the second composition. Item 13 includes the method of item 1, wherein the forming the charge storage layer includes forming a base dielectric layer; forming the metal nanocrystals on the base layer; and forming a fill dielectric layer around and over the metal nanocrystals.

Item 14 includes a method of forming a non-volatile memory (NVM) cell and a logic transistor using a semiconductor substrate, including forming a first dummy gate and a second dummy gate over a dummy gate dielectric; forming a sidewall spacer around the second dummy gate; forming first source/drains in the substrate adjacent to the second dummy gate; forming a dielectric layer around the first dummy gate and the second dummy gate wherein a top surface of the dielectric layer is substantially aligned with a top surface of the first dummy gate and a top surface of the second dummy gate; removing the first dummy gate and the second dummy gate; replacing the dummy dielectric with a high-k dielectric; replacing the first dummy gate with a select gate comprising a metal of a first type and the second dummy gate with a logic gate comprising a metal of the first type; forming a hard mask over the logic gate and the first source/drain regions; removing the dielectric layer from around the select gate while leaving the dielectric layer around the logic gate; forming a charge storage layer comprising metal nanocrystals over the semiconductor substrate; forming a metal layer over the charge storage layer; patterning the metal layer to form a control gate over a portion of the select gate and a portion of the substrate and removing the metal layer from over the hard mask; patterning the charge storage layer to leave a portion of the charge storage layer under the control gate and removing the charge storage layer over the hard mask; and forming second source/drains in the substrate adjacent to the select gate and control gate. Item 15 includes the method of item 14, and further includes removing the hard mask. Item 16 includes the method of item 15, and further includes siliciding the second source/drains prior to the removing the hard mask. Item 17 includes the method of item 16, and further includes siliciding the first source/drains prior to the forming the dielectric layer. Item 18 includes the method of item 14, wherein the replacing the first dummy gate further includes forming a metal of a second type on the metal of the first type.

Item 19 includes a method including forming a logic transistor having a metal logic gate, a high-k gate dielectric, a sidewall spacer around the metal logic gate, and silicided source/drains in a logic region of a semiconductor substrate and a metal select gate of a non-volatile memory (NVM) cell on a high-k dielectric and in an NVM portion of the semiconductor substrate using a dielectric that is left around the metal logic gate and the metal select gate, wherein a top surface of the dielectric is substantially aligned to a top surface of the metal select gate and a top surface of the metal logic gate; removing the dielectric from around the metal select gate; forming a charge storage layer comprising metal nanocrystals over the logic region and the NVM region; forming a metal layer over the logic region and the NVM region; patterning the metal layer over the NVM region to form a metal control gate over a portion of the metal select gate and a portion of the substrate and removing the metal layer from the logic region; etching the charge storage layer to leave the charge storage layer under and aligned with the metal control gate and to remove the charge storage layer over the logic region; and forming source/drain regions in the substrate in the NVM region adjacent to the metal control gate and to the metal select gate. Item 20 includes the method of item 19, and further includes forming a hard mask over the logic region prior to the removing the dielectric from around the metal select gate; siliciding the source/drain regions in the substrate in the NVM region; and removing the hard mask after the siliciding the source/drain regions in the substrate in the NVM region.

What is claimed is:

1. A method of forming an NVM cell and a logic transistor using a semiconductor substrate, comprising:
    in a non-volatile memory (NVM) region, forming over the semiconductor substrate a first high-k gate dielectric, a metal select gate, and a first dielectric layer, wherein the metal select gate is on the first high-k dielectric, a top surface of the first dielectric layer is substantially aligned with a top surface of the metal select gate, and the first dielectric layer has a first opening in which the metal select gate is present in the first opening;
    in a logic region, forming over the semiconductor substrate a second high-k gate dielectric, a metal logic gate, a source and a drain in the semiconductor substrate, and a second dielectric layer, wherein the metal logic gate is on the second high-k dielectric, a top surface of the second dielectric layer is substantially aligned with a top surface of the metal logic gate, and the second dielectric layer has a second opening in which the metal logic gate is present in the second opening;
    forming a hard mask over the NVM region and the logic region;
    removing the first dielectric layer in the NVM region while leaving the second dielectric layer in the logic region, wherein the forming the hard mask is performed prior to the removing the first dielectric layer;
    forming a charge storage layer comprising metal nanocrystals over the NVM region including over the metal select gate;
    forming a metal layer over the charge storage layer;
    patterning the metal layer to form a metal control gate; and
    etching the charge storage layer to leave a remaining portion of the storage layer aligned to the metal control gate.

2. The method of claim 1, wherein:
    the forming the charge storage layer is further characterized by forming the charge storage layer over the second dielectric layer and the metal logic gate; and
    the etching the storage layer is further characterized by removing the charge storage layer over the second dielectric and the metal logic gate.

3. The method of claim 2, wherein:
    the step of forming the metal layer is further characterized by forming the metal layer over the logic region; and
    the step of patterning the metal layer is further characterized by removing the metal layer over the logic region.

4. The method of claim 3, wherein the forming the first dielectric layer and forming the second dielectric layer are further characterized as forming the first dielectric and the second dielectric layers simultaneously of a same material.

5. The method of claim 1, further comprising forming a first silicide region on the source and a second silicide region on the drain of the logic transistor prior to the forming of the second dielectric layer.

6. The method of claim 5, further comprising:
    forming a sidewall spacer around the metal logic gate prior to the forming the second dielectric layer.

7. The method of claim 6, further comprising:
    forming a liner around the metal logic gate prior to the forming the sidewall spacer.

8. The method of claim 1, further comprising removing the hard mask from over the NVM region while leaving the hard mask over the logic region prior to removing the first dielectric layer.

9. The method of claim 1, wherein the forming the metal select gate and the forming the logic gate comprise a replacement gate process.

10. The method of claim 1, wherein:
    the forming the logic gate comprises forming a stack comprising a work-function-setting metal on the first high-k gate dielectric and a top metal over the work-function-setting metal.

11. The method of claim 1, wherein:
    the forming the metal logic gate comprises forming a stack having a first composition and the forming the metal select gate comprises forming a stack having a second composition wherein the first composition is different from the second composition.

12. The method of claim 1, wherein the forming the charge storage layer comprises:
    forming a base dielectric layer;
    forming the metal nanocrystals on the base layer; and
    forming a fill dielectric layer around and over the metal nanocrystals.

13. A method, comprising:
    forming a logic transistor having a metal logic gate, a high-k gate dielectric, a sidewall spacer around the metal logic gate, and silicided source/drains in a logic region of a semiconductor substrate and a metal select gate of a non-volatile memory (NVM) cell on a high-k dielectric and in an NVM portion of the semiconductor substrate using a dielectric that is left around the metal logic gate and the metal select gate, wherein a top surface of the dielectric is substantially aligned to a top surface of the metal select gate and a top surface of the metal logic gate;
    forming a hard mask over the NVM region and the logic region;
    removing the dielectric from around the metal select gate, wherein the forming the hard mask is performed prior to the removing the dielectric;
    forming a charge storage layer comprising metal nanocrystals over the logic region and the NVM region;
    forming a metal layer over the logic region and the NVM region;
    patterning the metal layer over the NVM region to form a metal control gate over a portion of the metal select gate and a portion of the substrate and removing the metal layer from the logic region;
    etching the charge storage layer to leave the charge storage layer under and aligned with the metal control gate and to remove the charge storage layer over the logic region; and forming source/drain regions in the substrate in the NVM region adjacent to the metal control gate and to the metal select gate.

14. The method of claim 13 further comprising:

siliciding the source/drain regions in the substrate in the NVM region; and removing the hard mask after the siliciding the source/drain regions in the substrate in the NVM region.

* * * * *